(12) United States Patent
Chen et al.

(10) Patent No.: US 8,669,897 B1
(45) Date of Patent: Mar. 11, 2014

(54) ASYNCHRONOUS SUCCESSIVE APPROXIMATION REGISTER ANALOG-TO-DIGITAL CONVERTER AND OPERATING METHOD THEREOF

(71) Applicant: United Microelectronics Corp., Hsin-Chu (TW)

(72) Inventors: Po-Hua Chen, Changhua County (TW); Hsueh-Chen Cheng, Hsinchu County (TW); Wen-Hong Hsu, Hsinchu (TW); Yu-Yee Liow, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/668,339

(22) Filed: Nov. 5, 2012

(51) Int. Cl.
H03M 1/38 (2006.01)

(52) U.S. Cl.
USPC .......................................... 341/161; 341/155

(58) Field of Classification Search
USPC .................. 341/155, 161, 163, 120
See application file for complete search history.

(56) References Cited

U.S. PATENT DOCUMENTS

| | | | |
|---|---|---|---|
| 3,663,828 A | 5/1972 | Low |
| 3,818,402 A | 6/1974 | Golaski |
| 4,163,944 A | 8/1979 | Chambers |
| 4,245,355 A | 1/1981 | Pascoe |
| 4,409,608 A | 10/1983 | Yoder |
| 4,816,784 A | 3/1989 | Rabjohn |
| 5,159,205 A | 10/1992 | Gorecki |
| 5,208,725 A | 5/1993 | Akcasu |
| 5,212,653 A | 5/1993 | Tanaka |
| 5,406,447 A | 4/1995 | Miyazaki |
| 5,446,309 A | 8/1995 | Adachi |
| 5,583,359 A | 12/1996 | Ng |
| 5,637,900 A | 6/1997 | Ker |
| 5,760,456 A | 6/1998 | Grzegorek |
| 5,808,330 A | 9/1998 | Rostoker |
| 5,923,225 A | 7/1999 | De Los Santos |
| 5,959,820 A | 9/1999 | Ker |
| 6,008,102 A | 12/1999 | Alford |
| 6,081,146 A | 6/2000 | Shiochi |
| 6,172,378 B1 | 1/2001 | Hull |
| 6,194,739 B1 | 2/2001 | Ivanov |
| 6,246,271 B1 | 6/2001 | Takada |
| 6,285,578 B1 | 9/2001 | Huang |
| 6,291,872 B1 | 9/2001 | Wang |
| 6,370,372 B1 | 4/2002 | Molnar |
| 6,407,412 B1 | 6/2002 | Iniewski |
| 6,427,226 B1 | 7/2002 | Mallick |
| 6,448,858 B1 | 9/2002 | Helms |
| 6,452,442 B1 | 9/2002 | Laude |
| 6,456,221 B2 | 9/2002 | Low |
| 6,461,914 B1 | 10/2002 | Roberts |
| 6,480,137 B2 | 11/2002 | Kulkarni |

(Continued)

*Primary Examiner* — Brian Young
(74) *Attorney, Agent, or Firm* — Winston Hsu; Scott Margo

(57) ABSTRACT

An asynchronous successive approximation register analog-to-digital converter includes a clock generator, a logic control unit, a sample and hold circuit, a digital-to-analog converter and a comparator. The clock generator is used to generate a clock signal. The logic control unit is for generating a sample and hold clock according to the clock signal. The sample and hold circuit is for sampling an analog signal according to the sample and hold clock to obtain and hold a sampling signal. The digital-to-analog converter is for generating a reference value according to a digital value transmitted from the logic control unit. The comparator is for generating a comparison value according to the sampling signal and the reference value.

13 Claims, 8 Drawing Sheets

(56) References Cited

U.S. PATENT DOCUMENTS

| | | |
|---|---|---|
| 6,483,188 B1 | 11/2002 | Yue |
| 6,486,765 B1 | 11/2002 | Katayanagi |
| 6,509,805 B2 | 1/2003 | Ochiai |
| 6,518,165 B1 | 2/2003 | Han |
| 6,521,939 B1 | 2/2003 | Yeo |
| 6,545,547 B2 | 4/2003 | Fridi |
| 6,560,306 B1 | 5/2003 | Duffy |
| 6,588,002 B1 | 7/2003 | Lampaert |
| 6,593,838 B2 | 7/2003 | Yue |
| 6,603,360 B2 | 8/2003 | Kim |
| 6,608,363 B1 | 8/2003 | Fazelpour |
| 6,611,223 B2 | 8/2003 | Low |
| 6,625,077 B2 | 9/2003 | Chen |
| 6,630,897 B2 | 10/2003 | Low |
| 6,639,298 B2 | 10/2003 | Chaudhry |
| 6,653,868 B2 | 11/2003 | Oodaira |
| 6,668,358 B2 | 12/2003 | Friend |
| 6,700,771 B2 | 3/2004 | Bhattacharyya |
| 6,703,951 B2 * | 3/2004 | Tsukamoto ................ 341/120 |
| 6,720,608 B2 | 4/2004 | Lee |
| 6,724,677 B1 | 4/2004 | Su |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar |
| 6,822,282 B2 | 11/2004 | Randazzo |
| 6,822,312 B2 | 11/2004 | Sowlati |
| 6,833,756 B2 | 12/2004 | Ranganathan |
| 6,841,847 B2 | 1/2005 | Sia |
| 6,847,572 B2 | 1/2005 | Lee |
| 6,853,272 B1 | 2/2005 | Hughes |
| 6,876,056 B2 | 4/2005 | Tilmans |
| 6,885,534 B2 | 4/2005 | Ker |
| 6,901,126 B1 | 5/2005 | Gu |
| 6,905,889 B2 | 6/2005 | Lowther |
| 6,909,149 B2 | 6/2005 | Russ |
| 6,927,664 B2 | 8/2005 | Nakatani |
| 6,958,522 B2 | 10/2005 | Clevenger |
| 7,009,252 B2 | 3/2006 | Lin |
| 7,027,276 B2 | 4/2006 | Chen |
| 7,098,840 B2 * | 8/2006 | Arigliano ................ 341/172 |
| 7,205,612 B2 | 4/2007 | Cai |
| 7,218,264 B1 * | 5/2007 | Shefer ................ 341/162 |
| 7,262,069 B2 | 8/2007 | Chung |
| 7,365,627 B2 | 4/2008 | Yen |
| 7,368,761 B1 | 5/2008 | Lai |
| 7,405,642 B1 | 7/2008 | Hsu |
| 7,672,100 B2 | 3/2010 | Van Camp |
| 8,134,487 B2 * | 3/2012 | Harpe ................ 341/163 |
| 8,451,156 B2 * | 5/2013 | Daniels et al. ................ 341/143 |
| 2002/0019123 A1 | 2/2002 | Ma |
| 2002/0036545 A1 | 3/2002 | Fridi |
| 2002/0188920 A1 | 12/2002 | Lampaert |
| 2003/0076636 A1 | 4/2003 | Ker |
| 2003/0127691 A1 | 7/2003 | Yue |
| 2003/0183403 A1 | 10/2003 | Kluge |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean |
| 2006/0108694 A1 | 5/2006 | Hung |
| 2006/0267102 A1 | 11/2006 | Cheng |
| 2007/0102745 A1 | 5/2007 | Hsu |
| 2007/0210416 A1 | 9/2007 | Hsu |
| 2007/0234554 A1 | 10/2007 | Hung |
| 2007/0246801 A1 | 10/2007 | Hung |
| 2007/0249294 A1 | 10/2007 | Wu |
| 2007/0296055 A1 | 12/2007 | Yen |
| 2008/0094166 A1 | 4/2008 | Hsu |
| 2008/0185679 A1 | 8/2008 | Hsu |
| 2008/0189662 A1 | 8/2008 | Nandy |
| 2008/0200132 A1 | 8/2008 | Hsu |
| 2008/0299738 A1 | 12/2008 | Hsu |
| 2008/0303623 A1 | 12/2008 | Hsu |
| 2009/0029324 A1 | 1/2009 | Clark |
| 2009/0201625 A1 | 8/2009 | Liao |
| 2010/0279484 A1 | 11/2010 | Wang |

* cited by examiner

US 8,669,897 B1

ASYNCHRONOUS SUCCESSIVE APPROXIMATION REGISTER ANALOG-TO-DIGITAL CONVERTER AND OPERATING METHOD THEREOF

BACKGROUND OF THE INVENTION

1. Field of the Invention

The present invention relates to an analog-to-digital converter, especially an asynchronous successive approximation register analog-to-digital converter.

2. Description of the Prior Art

The asynchronous successive approximation register analog-to-digital converter (ASAR ADC) is a converter for converting continuous analog data into discrete binary digital signals. Because ASAR ADCs have advantages of low cost and high compatibility, ASAR ADCs are widely applied in the field of very large scale integration (VLSI) and system on chip (SOC), such as battery-powered instruments and quantizers. In general, an ASAR ADC includes a comparator for comparing a sample and hold clock with a reference voltage, to successively determine the digital code of each bit, until finishing the conversion of the least significant bit (LSB).

However, for an N-bit ASAR ADC, it is difficult to perform N-bit conversion because the meta-stability effect will occur when a prior art ASAR ADC performs multiple bit data processing, causing the total data comparison time being longer than the allowable time of the external clock. In other words, the low frequency of the external clocks makes the ASAR ADC unable to complete data comparison on time, thus the prior ASAR ADC is unable to correctly convert analog data into digital signals.

SUMMARY OF THE INVENTION

An embodiment of the present invention relates to an asynchronous successive approximation register analog-to-digital converter. The ASAR ADC comprises a clock generator, a logic control unit, a sample and hold circuit, a digital-to-analog converter and a comparator. The clock generator is used for generating a clock signal according to an external clock, a frequency of the clock signal being higher than a frequency of the external clock. The logic control unit is coupled to the clock generator for generating a sample and hold clock according to the clock signal. The sample and hold circuit is coupled to the logic control unit for sampling an analog signal according to the sample and hold clock to obtain and hold a sampling signal. The digital-to-analog converter is coupled to the logic control unit for generating a reference value according to a digital value transmitted from the logic control unit. The comparator is coupled to the sample and hold circuit and the digital-to-analog converter for generating a comparison value according to the sampling signal and the reference value.

Another embodiment of the present invention relates to a method for operating an asynchronous successive approximation register analog-to-digital converter. The method comprises generating a clock signal according to an external clock, generating a sample and hold clock according to the clock signal, sampling an analog signal according to the sample and hold clock to obtain and hold a sampling signal, generating a reference value according to a digital value, and generating a comparison value according to the sampling signal and the reference value. A frequency of the clock signal is higher than a frequency of the external clock.

These and other objectives of the present invention will no doubt become obvious to those of ordinary skill in the art after reading the following detailed description of the preferred embodiment that is illustrated in the various figures and drawings.

DETAILED DESCRIPTION

Some phrases are referred to specific elements in the present specification and claims, please notice that the manufacturer might use different terms to refer to the same elements. However, the definition between elements is based on their functions instead of their names. Further, in the present specification and claims, the term "comprising" is open type and should not be viewed as the term "consisted of." Besides, the term "electrically coupled" can be referred to either directly connecting or indirectly connecting between elements. Thus, if it is described in the below contents of the present invention that a first device is electrically coupled to a second device, the first device can be directly connected to the second device, or indirectly connected to the second device through other devices or means.

The embodiments and figures are provided as follows in order to illustrate the present invention in detail, but please notice that the claimed scope of the present invention is not limited by the provided embodiments and figures.

Figure 1:
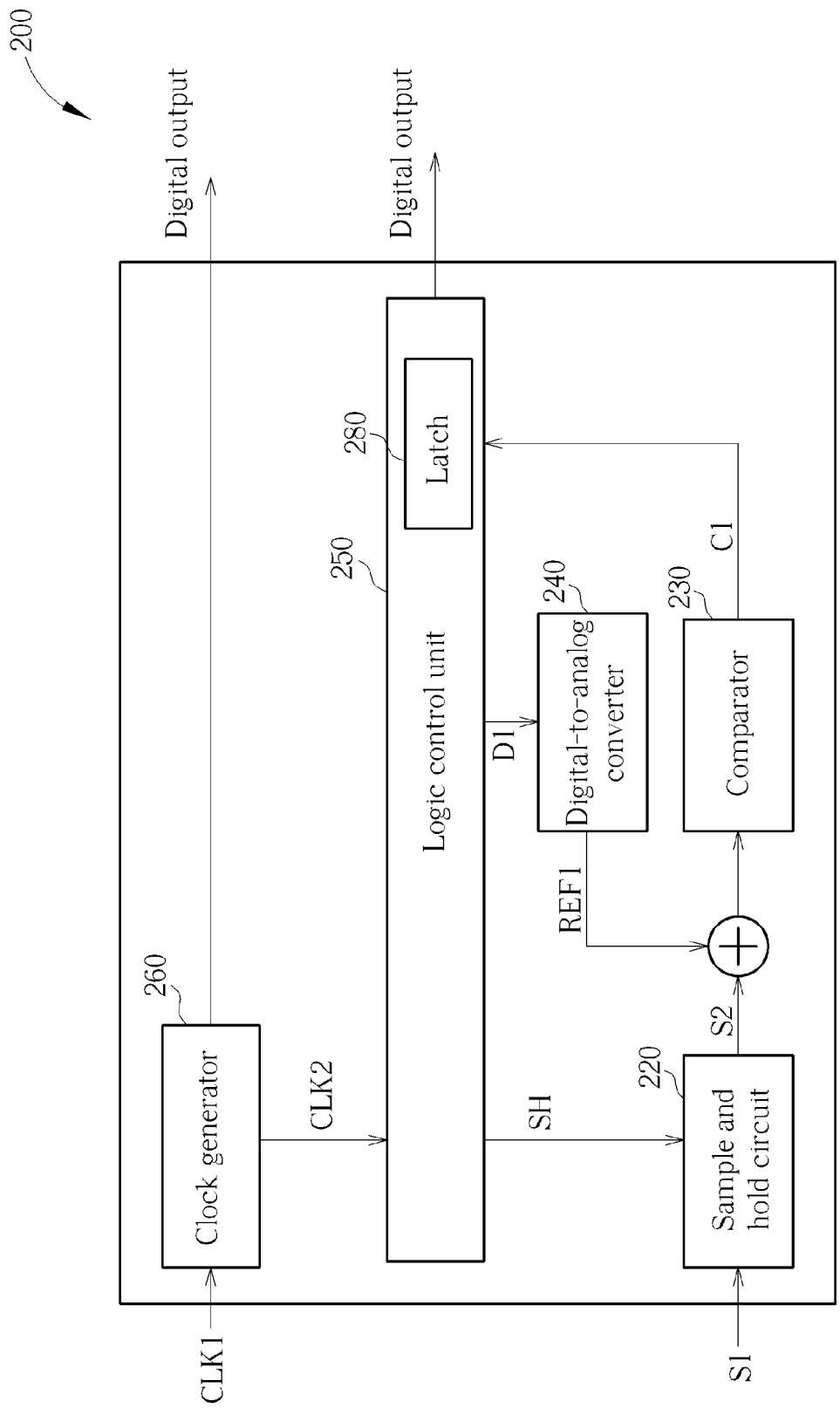
FIG. 1 shows an ASAR ADC according to a first embodiment of the present invention.

Please refer to FIG. 1, which shows an ASAR ADC 200 according to a first embodiment of the present invention. As shown in FIG. 1, the ASAR ADC 200 comprises a clock generator 260, a logic control unit 250, a sample and hold circuit 220, a digital-to-analog converter 240 and a comparator 230. The clock generator 260 is used for generating a clock signal CLK2 according to an external clock CLK1, and the frequency of the clock signal CLK2 is higher than the frequency of the external clock CLK1. The clock generator 260 can be a phase locked loop. The logic control unit 250 is coupled to the clock generator 260 for generating a sample and hold clock SH according to the clock signal CLK2. The sample and hold circuit 220 is coupled to the logic control unit 250 for sampling an analog signal S1 according to the sample and hold clock SH to obtain and hold a sampling signal S2, and the sample and hold circuit 220 can include a capacitor. The digital-to-analog converter 240 is coupled to the logic control unit 250 for generating a reference value REF1 according to a digital value D1 transmitted from the logic control unit 250. The comparator 230 is coupled to the sample and hold circuit 220 and the digital-to-analog converter 240 for generating a comparison value C1 according to the sampling signal S2 and the reference value REF1. Besides, the logic control unit 250 can be configured to include a latch 280 for latching and outputting the comparison value C1 generated from the comparator 230.

Figure 2:
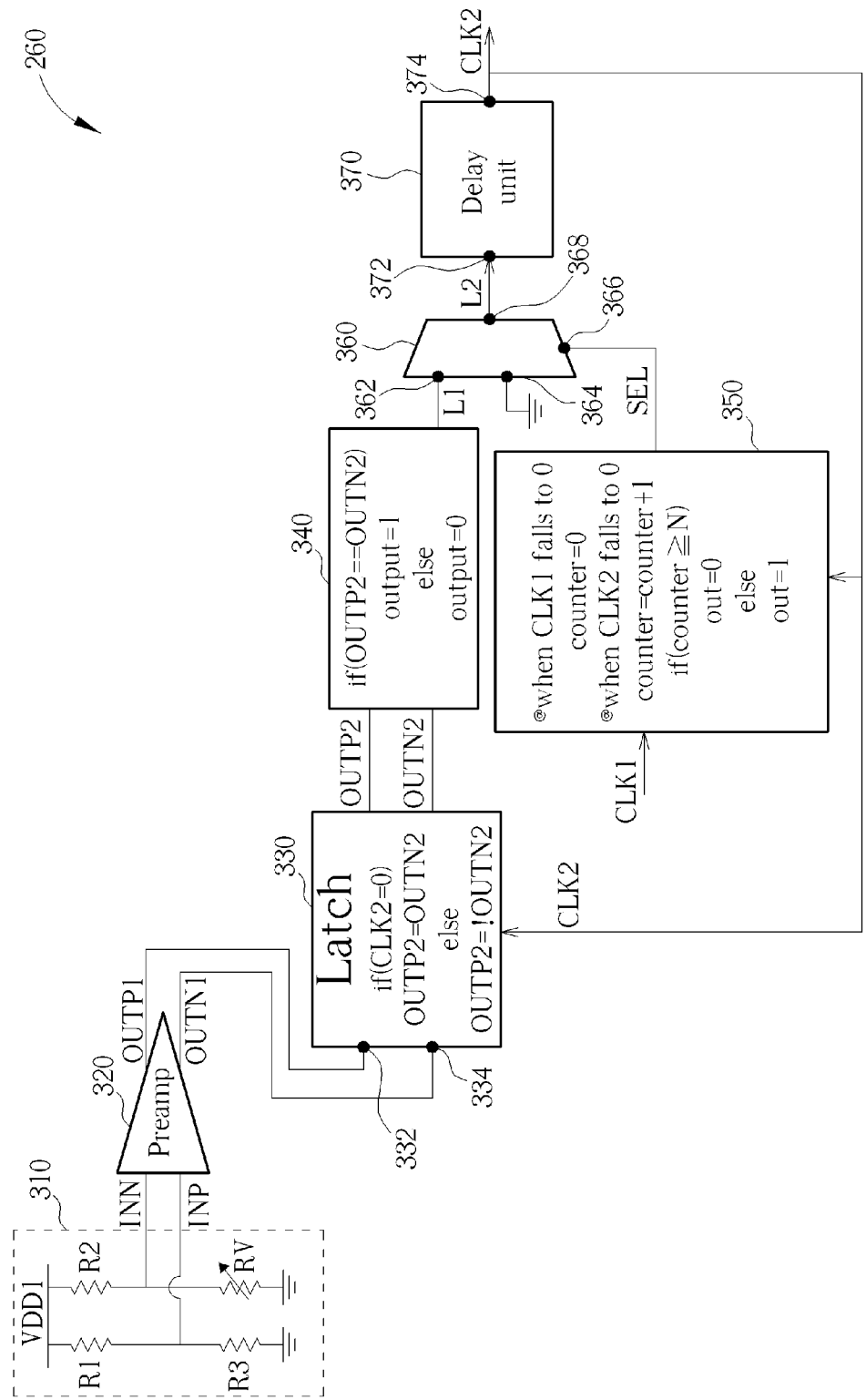
FIG. 2 shows the clock generator of the ASAR ADC in FIG. 1.

Please refer to FIG. 2, which shows the clock generator 260 of the ASAR ADC 200 in FIG. 1. As shown in FIG. 2, the clock generator 260 comprises a differential voltage generator 310, an amplifier 320, a latch 330, a logic unit 340, a counter 350, a multiplexer 360 and a delay unit 370. The differential voltage generator 310 is used for generating a first set of differential voltages INN and INP. The amplifier 320 is coupled to the differential voltage generator 310 for generating a second set of differential voltages OUTP1 and OUTN1 according to the first set of differential voltages INN and INP. The latch 330 is coupled to the amplifier 320 for generating a third set of differential voltages OUTP2 and OUTN2 according to the second set of differential voltages OUTP1 and OUTN1 and the clock signal CLK2. The logic unit 340 is coupled to the latch 330 for outputting a first logic signal L1 according to whether two differential voltages of the third set of differential voltages OUTP2 and OUTN2 are the same. The counter 350 is used for outputting a select signal SEL according to the external clock CLK1 and the clock signal CLK2. The multiplexer 360 comprises a first input end 362, a second input end 364, a select end 366 and an output end 368. The first input end 362 is coupled to the logic unit 340 for receiving the first logic signal L1. The second input end 364 is coupled to the ground end. The select end 366 is coupled to the counter 350 for receiving the select signal SEL. The output end 368 is used for outputting a second logic signal L2. The delay unit 370 is used for adjusting a frequency of the second logic signal L2 to generate the clock signal CLK2, and comprises an input end 372 and an output end 374. The input end 372 is coupled to the output end 368 of the multiplexer 360 for receiving the second logic signal L2. The output end 374 is coupled to the latch 330 and the counter 350 for outputting the clock signal CLK2.

The differential voltage generator 310 comprises a first resistor R1, a second resistor R2, a third resistor R3 and a variable resistor RV. The first end of the first resistor R1 and the first end of the second resistor R2 are both coupled to a first voltage source VDD1, and the resistance of the second resistor R2 is equal to the resistance of the first resistor R1. The third resistor R3 is coupled between the second end of the first resistor R1 and the ground end, and the variable resistor RV is coupled between the second end of the second resistor R2 and the ground end. By adjusting the resistance of the variable resistance RV, the voltage levels of the differential voltages INN and INP can be adjusted to be equal or unequal. In other words, through adjusting the resistance of the variable resistance RV, the clock generator 260 can output the clock signal CLK2 with variable frequencies.

In FIG. 2, behavioral descriptions are shown in the latch 330, the logic unit 340 and the counter 350. The symbol "==" represents "equal," the symbol ">=" represents "greater than or equal to," the symbol "!OUTN" represents the inverse logical value of "OUTN," e.g. the inverse logical value of 1 is 0, and the symbol "@ . . . " represents "at instance of . . . ." However, those behavioral descriptions are simply for example, not for limiting the scope of the present invention.

Figure 3A:
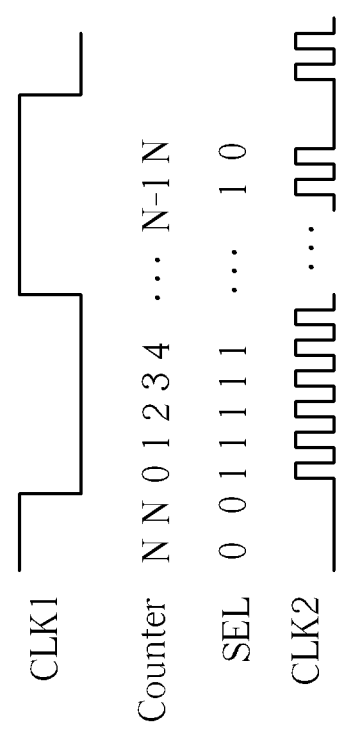
FIG. 3A shows the timing diagram of the clock generator in FIG. 2.

Please refer to FIG. 3A, which shows the timing diagram of the clock generator 260 in FIG. 2. When the level of the external clock CLK1 changes to 0 from 1, the counter 350 will reset the count to 0. When the level of the clock signal CLK2 changes to 0 from 1, the counter 350 will increment its count, and the counting sequence is as "0, 1, 2, . . . , N." When the count of the counter 350 is smaller than N, the select signal SEL outputted to the select end 366 of the multiplexer 360 is 1. When the count of the counter 350 is N, the select signal SEL outputted to the select end 366 of the multiplexer 360 is 0, and the count no longer increments. The multiplexer 360 outputs the ground voltage or the logic signal L1 according to the select signal SEL. When the level of the select signal SEL is 0, the multiplexer 360 outputs the ground voltage. When the level of the select signal SEL is 1, the multiplexer 360 outputs the logic signal L1.

When the latch 330 receives the second set of differential voltages OUTP1 and OUTN1, if the level of the clock signal CLK2 is 0, the third set of differential voltages OUTP2 and OUTN2 with the same level will be outputted to the logic unit 340, and then the logic signal L1 outputted by the logic unit 340 will be 1. If the level of the clock signal CLK2 is not 0, the third set of differential voltages OUTP2 and OUTN2 with different levels will be outputted to the logic unit 340, and then the logic signal L1 outputted by the logic unit 340 will be 0.

Figure 3B:
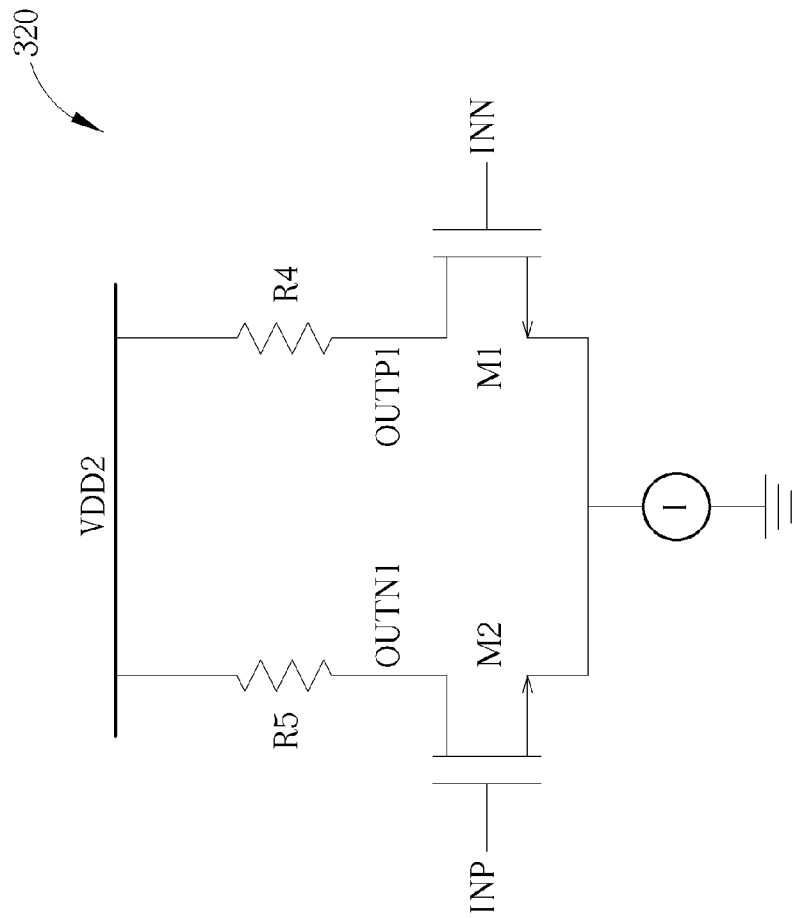
FIG. 3B shows the amplifier in FIG. 2.

Please refer to FIG. 3B, which shows the amplifier 320 in FIG. 2. As shown in FIG. 3B, the amplifier 320 comprises a fourth resistor R4, a fifth resistor R5, a first N type metal oxide semiconductor (NMOS) M1, a second NMOS M2 and a current source I. The fourth resistor R4 has a first end coupled to a second voltage source VDD2, and a second end coupled to the first input end 332 of the latch 330. The fifth resistor R5 has a first end coupled to the second voltage source VDD2, and a second end coupled to the second input end 334 of the latch 330. The resistance of the fourth resistor R4 is equal to the resistance of the fifth resistor R5, and the second voltage source VDD2 can be substantially the same as or different from the first voltage source VDD1.

The first N type metal oxide semiconductor transistor M1 comprises a drain coupled to the second end of the fourth resistor R4, a source, and a control end coupled to the second end of the second resistor R2 for receiving the differential voltage INN of the first set of differential voltages INN and INP. The second NMOS M2 has the same channel width-to-length ratio as the first NMOS M1. The second NMOS M2 comprises a drain coupled to the second end of the fifth resistor R5, a source, and a control end coupled to the second end of the first resistor R1 for receiving the differential voltage INP of the first set of differential voltages INN and INP. The current source I has a first end coupled to the source of the first NMOS M1 and the source of the second NMOS M2, and a second end coupled to the ground end. Although NMOS is used in the current embodiment, the present invention is not limited to NMOS. For example, the NMOS can be replaced with P type metal oxide semiconductor (PMOS).

Figure 4:
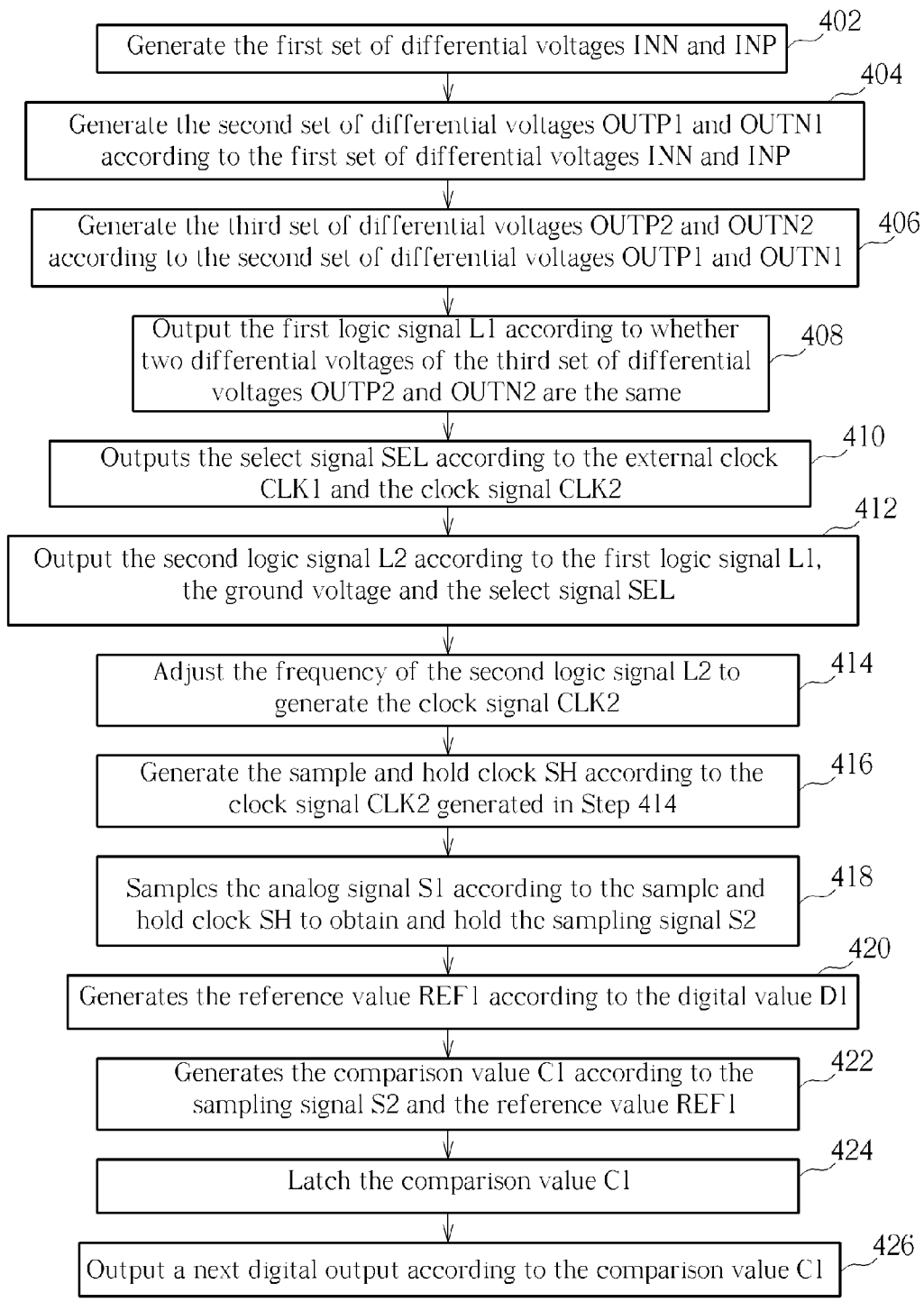
FIG. 4 shows an operation flowchart of the ASAR ADC in FIG. 1.

Please refer to FIG. 4, which shows an operation flowchart of the ASAR ADC 200 in FIG. 1. The operation is as follows:

Step 402: generate the first set of differential voltages INN and INP;

Step 404: generate the second set of differential voltages OUTP1 and OUTN1 according to the first set of differential voltages INN and INP;

Step 406: generate the third set of differential voltages OUTP2 and OUTN2 according to the second set of differential voltages OUTP1 and OUTN1 and the clock signal CLK2;

Step 408: output the first logic signal L1 according to whether two differential voltages of the third set of differential voltages OUTP2 and OUTN2 are the same;

Step 410: output the select signal SEL according to the external clock CLK1 and the clock signal CLK2;

Step 412: output the second logic signal L2 according to the first logic signal L1, the ground voltage and the select signal SEL;

Step 414: adjust the frequency of the second logic signal L2 to generate the following clock signal CLK2;

Step 416: generate the sample and hold clock SH according to the clock signal CLK2 generated in Step 414;

Step 418: sample the analog signal S1 according to the sample and hold clock SH to obtain and hold the sampling signal S2;

Step 420: generate the reference value REF1 according to the digital value D1;

Step 422: generate the comparison value C1 according to the sampling signal S2 and the reference value REF1;

Step 424: latch the comparison value C1;

Step 426: output a next digital output according to the comparison value C1.

According to the configuration of the ASAR ADC 200 in the first embodiment, the frequency of the clock signal CLK2 is higher than the frequency of the external clock CLK1, thus when performing high speed N-bit data processing, all analog data can be converted within the allowable time to generate correct digital outputs.

Figure 5:
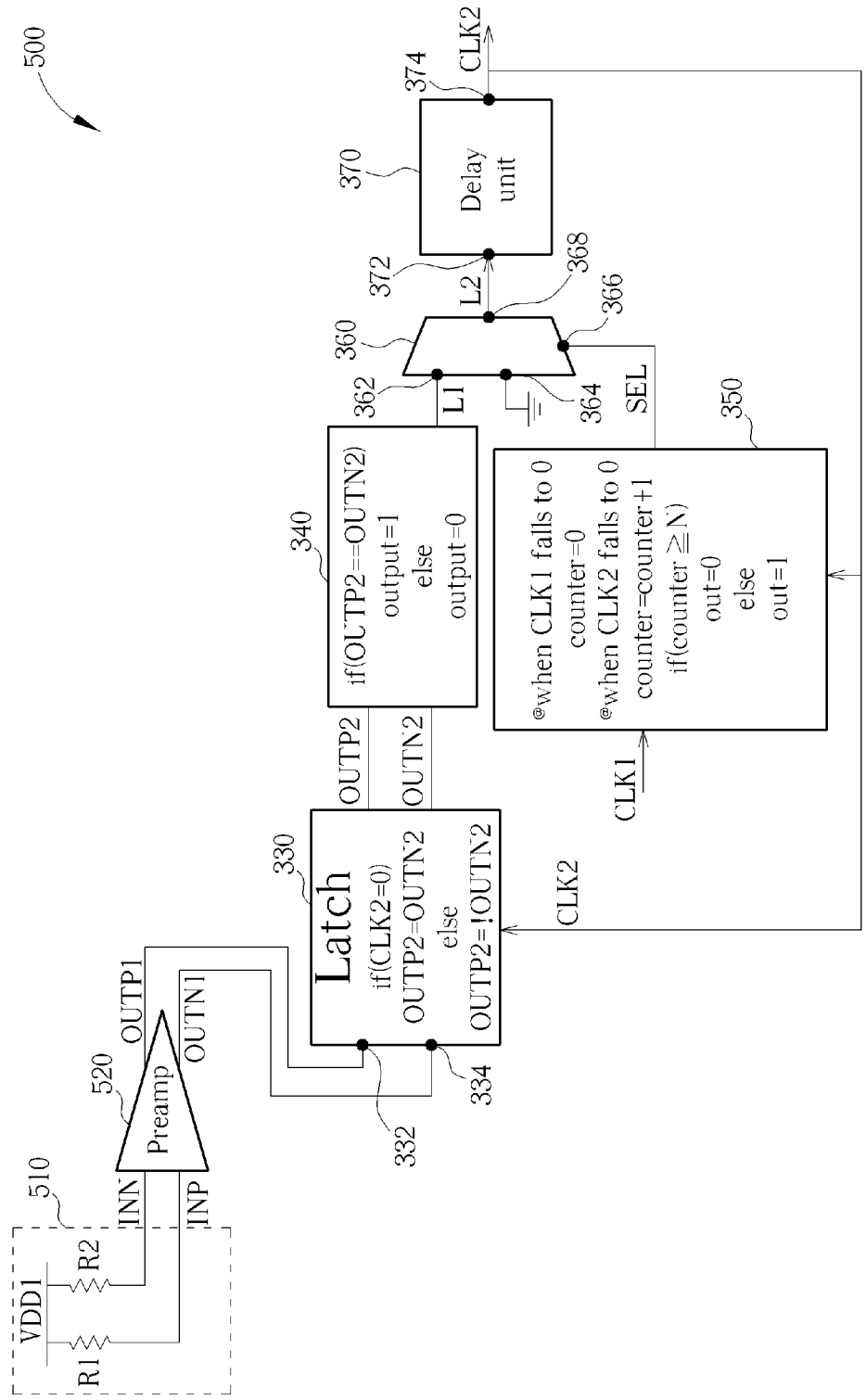
FIG. 5 shows a clock generator of the ASAR ADC in FIG. 1 according to a second embodiment of the present invention.
Figure 6:
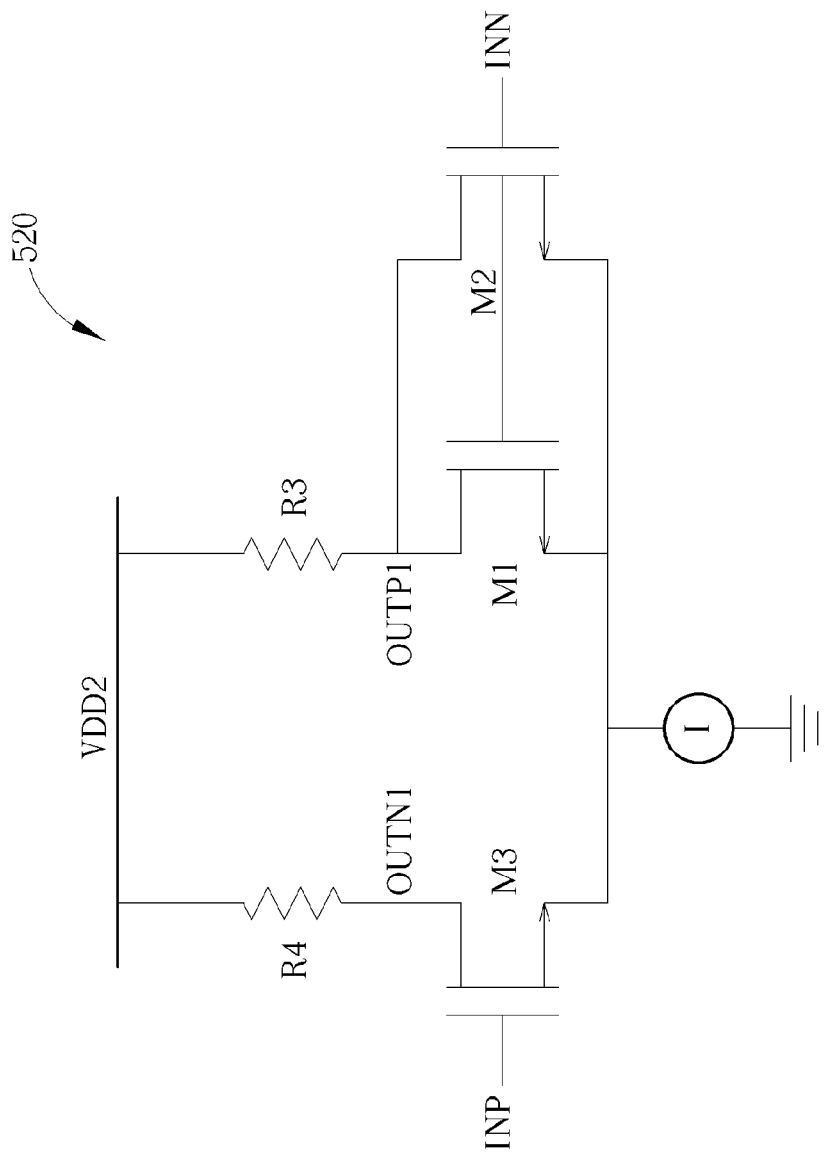
FIG. 6 shows the amplifier in FIG. 5.

Please refer to FIGS. 5 and 6, FIG. 5 shows a clock generator 500 of the ASAR ADC 200 in FIG. 1 according to a second embodiment of the present invention, and FIG. 6 shows the amplifier 520 of the clock generator 500 in FIG. 5. As shown in FIG. 5, the differential voltage generator 510 comprises a first resistor R1 and a second resistor R2. The first end of the first resistor R1 and the first end of the second resistor R2 are both coupled to the first voltage source VDD1, and the resistance of the first resistor R1 is equal to the resistance of the second resistor R2. The behavioral descriptions of the clock generator 500 are equivalent to those of the clock generator 260, and the pulses for operating the clock generator 500 can also be referred to FIG. 3A and thus will not be further described herewith.

As shown in FIG. 6, the amplifier 520 comprises a third resistor R3, a fourth resistor R4, a first NMOS M1, a second NMOS M2, a third NMOS M3 and a current source I. The third resistor R3 has a first end coupled to the second voltage source VDD2, and a second end coupled to the first input end 332 of the latch 330. The fourth resistor R4 has a first end coupled to the second voltage source VDD2, and a second end coupled to the second input end 334 of the latch 330. The resistance of the fourth resistor R4 is equal to the resistance of the third resistor R3, and the second voltage source VDD2 can be substantially the same as or different from the first voltage source VDD1. The first NMOS M1 comprises a drain coupled to the second end of the third resistor R3, a source, and a control end coupled to the second end of the second resistor R2 for receiving the differential voltage INN of the first set of differential voltages INN and INP. The second NMOS M2 comprises a drain coupled to the second end of the third resistor R3, a source coupled to the source of the first NMOS M1, and a control end coupled to the second end of the second resistor R2 or the ground end. The third NMOS M3 has the same channel width-to-length ratio as the first NMOS M1. The third NMOS M3 comprises a drain coupled to the second end of the fourth resistor R4, a source, and a control end coupled to the second end of the first resistor R1 for receiving the differential voltage INP of the first set of differential voltages INN and INP. The current source I comprises a first end coupled to the source of the first NMOS M1 and the source of the third NMOS M3, and a second end coupled to the ground end. Although in FIG. 6, the first NMOS M1 only couples with one NMOS M2 in parallel, the present invention is not limited to that. The first NMOS M1 can be configured to couple more NMOS in parallel. By changing the number of NMOS coupled to the first NMOS M1 in parallel, the amplifier 520 can output the second set of differential voltages OUTP1 and OUTN1 with the same or different voltage levels accordingly to adjust the frequencies of the clock signal CLK2.

In short, the difference between the clock generators 260 and 500 is that, the clock generator 260 adjusts differential voltages INN and INP by adjusting the resistance of the variable resistor RV of the differential voltage generator 310 to output the clock signal CLK2 with variable frequencies, but the clock generator 500 changes differential voltages INN and INP by changing the number of NMOS coupled in parallel with the first NMOS M1 to output the clock signal CLK2 with variable frequencies.

Figure 7:
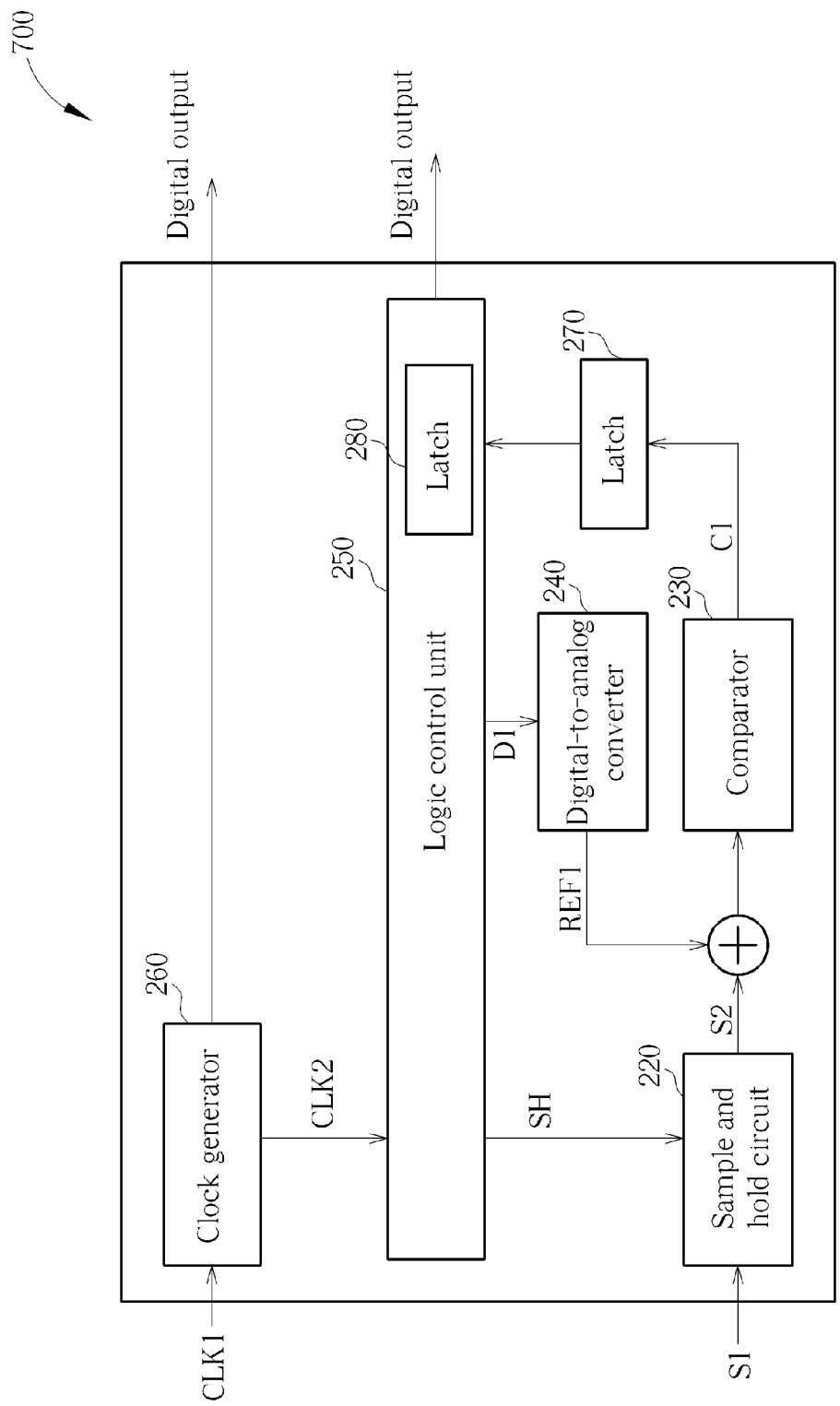
FIG. 7 shows an ASAR ADC according to a third embodiment of the present invention.

Please refer to FIG. 7, which shows an ASAR ADC 700 according to the third embodiment of the present invention. The difference between the ASAR ADCs 200 and 700 is that, the ASAR ADC 700 further comprises a latch 270 coupled between the comparator 230 and the logic control unit 250 for latching the comparison value C1 and outputting the comparison value C1 to the logic control unit 250, so as to enable the logic control unit 250 to output a next digital value according to the comparison value C1.

Similarly, according to the configuration of the ASAR ADC 700 in the third embodiment, the frequency of the clock signal CLK2 is higher than the frequency of the external clock CLK1, thus when performing high speed multiple bits data processing, all analog data can be converted within the allowable time to generate correct digital outputs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An asynchronous successive approximation register analog-to-digital converter comprising:
   a clock generator for generating a clock signal according to an external clock, a frequency of the clock signal being higher than a frequency of the external clock;
   a logic control unit coupled to the clock generator for generating a sample and hold clock according to the clock signal;
   a sample and hold circuit coupled to the logic control unit for sampling an analog signal according to the sample and hold clock to obtain and hold a sampling signal;
   a digital-to-analog converter coupled to the logic control unit for generating a reference value according to a digital value transmitted from the logic control unit;
   a comparator coupled to the sample and hold circuit and the digital-to-analog converter for generating a comparison value according to the sampling signal and the reference value.

2. The asynchronous successive approximation register analog-to-digital converter of claim 1, further comprising a latch, coupled between the comparator and the logic control unit for latching the comparison value and outputting the comparison value to the logic control unit, so as to enable the logic control unit to output a next digital value according to the comparison value.

3. The asynchronous successive approximation register analog-to-digital converter of claim 1, wherein the logic control unit comprises a latch for latching the comparison value.

4. The asynchronous successive approximation register analog-to-digital converter of claim 1, wherein the sample and hold circuit comprises a capacitor.

5. The asynchronous successive approximation register analog-to-digital converter of claim 1, wherein the clock generator is a phase locked loop.

6. The asynchronous successive approximation register analog-to-digital converter of claim 1, wherein the clock generator comprises:

a differential voltage generator for generating a first set of differential voltages;

an amplifier coupled to the differential voltage generator for generating a second set of differential voltages according to the first set of differential voltages;

a latch coupled to the amplifier for generating a third set of differential voltages according to the second set of differential voltages;

a logic unit coupled to the latch for outputting a first logic signal according to whether two differential voltages of the third set of differential voltages are the same;

a counter for outputting a select signal according to the external clock and the clock signal;

a multiplexer, comprising:
 a first input end coupled to the logic unit for receiving the first logic signal;
 a second input end coupled to a ground end;
 a select end coupled to the counter for receiving the select signal; and
 an output end for outputting a second logic signal; and a delay unit for adjusting a frequency of the second logic signal to generate the clock signal, comprising:
 an input end coupled to the output end of the multiplexer for receiving the second logic signal; and
 an output end coupled to the latch and the counter for outputting the clock signal.

7. The asynchronous successive approximation register analog-to-digital converter of claim 6, wherein the differential voltage generator comprises:
 a first resistor having a first end coupled to a first voltage source;
 a second resistor having a first end coupled to the first voltage source, a resistance of the second resistor being equal to a resistance of the first resistor;
 a third resistor coupled between a second end of the first resistor and the ground end; and
 a variable resistor coupled between a second end of the second resistor and the ground end.

8. The asynchronous successive approximation register analog-to-digital converter of claim 7, wherein the amplifier comprises:
 a fourth resistor having a first end coupled to the first voltage source or a second voltage source, and a second end coupled to a first input end of the latch;
 a fifth resistor having a first end coupled to the first voltage source or the second voltage source, and a second end coupled to a second input end of the latch, a resistance of the fourth resistor being equal to a resistance of the fifth resistor;
 a first N type metal oxide semiconductor transistor comprising:
  a drain coupled to the second end of the fourth resistor;
  a source; and
  a control end coupled to the second end of the second resistor for receiving a first voltage of the first set of differential voltages;
 a second N type metal oxide semiconductor transistor having the same channel width-to-length ratio as the first N type metal oxide semiconductor transistor, comprising:
  a drain coupled to the second end of the fifth resistor;
  a source; and
  a control end coupled to the second end of the first resistor for receiving a second voltage of the first set of differential voltages; and
 a current source comprising:
  a first end coupled to the source of the first N type metal oxide semiconductor transistor and the source of the second N type metal oxide semiconductor transistor; and
  a second end coupled to the ground end.

9. The asynchronous successive approximation register analog-to-digital converter of claim 6, wherein the differential voltage generator comprises:
 a first resistor having a first end coupled to a first voltage source; and
 a second resistor having a first end coupled to the first voltage source, a resistance of the first resistor being equal to a resistance of the second resistor.

10. The asynchronous successive approximation register analog-to-digital converter of claim 9, wherein the amplifier comprises:
 a third resistor having a first end coupled to the first voltage source or a second voltage source, and a second end coupled to a first input end of the latch;
 a fourth resistor having a first end coupled to the first voltage source or the second voltage source, and a second end coupled to a second input end of the latch, a resistance of the fourth resistor being equal to a resistance of the third resistor;
 a first N type metal oxide semiconductor transistor comprising:
  a drain coupled to the second end of the third resistor;
  a source; and
  a control end coupled to the second end of the second resistor for receiving a first voltage of the first set of differential voltages;
 at least one second N type metal oxide semiconductor transistor, each second N type metal oxide semiconductor transistor of the at least one second N type metal oxide semiconductor transistor comprising:
  a drain coupled to the second end of the third resistor;
  a source, coupled to the source of the first N type metal oxide semiconductor transistor; and
  a control end coupled to the second end of the second resistor or the ground end;
 a third N type metal oxide semiconductor transistor having the same channel width-to-length ratio as the first N type metal oxide semiconductor transistor, comprising:
  a drain coupled to the second end of the fourth resistor;
  a source; and
  a control end coupled to the second end of the first resistor for receiving a second voltage of the first set of differential voltages; and
 a current source, comprising:
  a first end coupled to the source of the first N type metal oxide semiconductor transistor and the source of the third N type metal oxide semiconductor transistor; and
  a second end coupled to the ground end.

11. A method for operating an asynchronous successive approximation register analog-to-digital converter, comprising:
 generating a first set of differential voltages;
 generating a second set of differential voltages according to the first set of differential voltages;
 generating a third set of differential voltages according to the second set of differential voltages;
 outputting a first logic signal according to whether two differential voltages of the third set of differential voltages are the same;
 outputting a select signal according to an external clock and a clock signal;

outputting a second logic signal according to the first logic signal, a ground voltage and the select signal;

adjusting a frequency of the second logic signal to generate the clock signal according to an external clock, a frequency of the clock signal being higher than a frequency of the external clock;

generating a sample and hold clock according to the clock signal;

sampling an analog signal according to the sample and hold clock to obtain and hold a sampling signal;

generating a reference value according to a digital value; and generating a comparison value according to the sampling signal and the reference value.

12. The method of claim 11, further comprising:
latching the comparison value.

13. The method of claim 12, further comprising:
outputting a next digital value according to the comparison value.

* * * * *